United States Patent
Gao

(10) Patent No.: US 10,419,007 B2
(45) Date of Patent: Sep. 17, 2019

(54) DIGITAL FREQUENCY-DIVISION PHASE-LOCKED LOOP

(71) Applicant: Huawei Technologies Co., Ltd., Shenzhen (CN)

(72) Inventor: Peng Gao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/169,378

(22) Filed: Oct. 24, 2018

(65) Prior Publication Data
US 2019/0058481 A1    Feb. 21, 2019

Related U.S. Application Data

(63) Continuation of application No. PCT/CN2017/079446, filed on Apr. 5, 2017.

(30) Foreign Application Priority Data

Apr. 25, 2016   (CN) .......................... 2016 1 0260615

(51) Int. Cl.
*H03L 7/06*    (2006.01)
*H03L 7/093*   (2006.01)
(Continued)

(52) U.S. Cl.
CPC ............... *H03L 7/093* (2013.01); *H03L 7/08* (2013.01); *H03L 7/0802* (2013.01);
(Continued)

(58) Field of Classification Search
CPC ..... H03L 2207/50; H03L 7/085; H03L 7/093; H03L 7/1976
See application file for complete search history.

(56) References Cited

U.S. PATENT DOCUMENTS 9,025,965 B2    5/2015  Lee et al.
2009/0072913 A1 3/2009  Eikenbroek
(Continued)

FOREIGN PATENT DOCUMENTS

CN    101414821 A    4/2009
CN    103716048 A    4/2014
(Continued)

OTHER PUBLICATIONS

Machine Translation and Abstract of Chinese Publication No. CN101414821, Apr. 22, 2009, 38 pages.
(Continued)

*Primary Examiner* — Sibin Chen
(74) *Attorney, Agent, or Firm* — Conley Rose, P.C.

(57) ABSTRACT

A digital frequency-division phase-locked loop, including a time-to-digital converter (TDC), a digital loop filter (DLF), a digital-controlled oscillator (DCO), a feedback frequency divider (DIV), a sigma-delta modulator (SDM), and a calibration apparatus, where the calibration apparatus compensates for, based on a frequency control word and a frequency-division control word generated by the SDM, a digital signal output by the TDC to obtain a calibration signal. The DLF performs digital filtering on the calibration signal to obtain an oscillator frequency control signal and set the oscillator frequency control signal as an output signal of the DCO.

20 Claims, 8 Drawing Sheets

(51) Int. Cl.
*H03L 7/08* (2006.01)
*H03L 7/099* (2006.01)
*H03L 7/197* (2006.01)
*H03L 7/18* (2006.01)

(52) U.S. Cl.
CPC .............. *H03L 7/0992* (2013.01); *H03L 7/18* (2013.01); *H03L 7/197* (2013.01); *H03L 7/1976* (2013.01); *H03L 2207/50* (2013.01)

(56) References Cited

U.S. PATENT DOCUMENTS

| | | |
|---|---|---|
| 2013/0033293 A1 | 2/2013 | Zhang |
| 2014/0097875 A1 | 4/2014 | Tertinek et al. |
| 2014/0218009 A1* | 8/2014 | Canard ................ G01R 29/023 324/76.39 |
| 2016/0241301 A1 | 8/2016 | Pavlovic et al. |
| 2017/0288686 A1 | 10/2017 | Gao et al. |

FOREIGN PATENT DOCUMENTS

| | | |
|---|---|---|
| CN | 103814524 A | 5/2014 |
| CN | 104506190 A | 4/2015 |
| CN | 105897259 A | 8/2016 |
| CN | 105959003 A | 9/2016 |

OTHER PUBLICATIONS

Machine Translation and Abstract of Chinese Publication No. CN105959003, Sep. 21, 2016, 20 pages.
Ravi, A., et al., "A 9.2-12GHz, 90nm digital fractional-N synthesizer with stochastic TDC calibration and -35/-41dBc integrated phase noise in the 5/2.5GHz bands," Vlsi Circuits, 2010, vol. 29, No. 16, pp. 143-144.
Foreign Communication From a Counterpart Application, Chinese Application No. 201610260615.7, Chinese Office Action dated May 16, 2018, 8 pages.
Foreign Communication From a Counterpart Application, PCT Application No. PCT/CN2017/079446, English Translation of International Search Report dated May 22, 2017, 2 pages.
Foreign Communication From a Counterpart Application, PCT Application No. PCT/CN2017/079446, English Translation of Written Opinion dated May 22, 2017, 7 pages.

\* cited by examiner

DIGITAL FREQUENCY-DIVISION PHASE-LOCKED LOOP

CROSS-REFERENCE TO RELATED APPLICATIONS

This application is a continuation of International Patent Application No. PCT/CN2017/079446 filed on Apr. 5, 2017, which claims priority to Chinese Patent Application No. 201610260615.7 filed on Apr. 25, 2016. The disclosures of the aforementioned applications are hereby incorporated by reference in their entireties.

TECHNICAL FIELD

This application relates to the field of electronic information, and in particular, to a digital frequency-division phase-locked loop.

BACKGROUND

In a radio frequency (RF) transceiver, a frequency synthesizer based on a phase-locked loop (also referred to as PLL) structure is widely used to generate a local oscillator (LO) signal in order to complete a frequency shift operation on an RF signal. Because of advantages in aspects such as locking time, integral phase noise, and design flexibility, a digital fractional frequency-division phase-locked loop that can implement both integer frequency division and fractional frequency division is more widely applied than an integer frequency-division phase-locked loop.

In the digital fractional frequency-division phase-locked loop, linear performance of a time-to-digital converter (TDC) that serves as an important analog component is a main factor that affects linear performance of the entire phase-locked loop system. Because greater approximation to linearity leads to less noise, improving the linear performance of the TDC is a key factor for ensuring that the digital fractional frequency-division phase-locked loop remains at a low noise level.

However, for a current common TDC structure, factors affecting linearity of the TDC mainly include component mismatch, layout design mismatch, and the like. Generally, improving the linearity of the TDC requires relatively great expense in aspects such as power consumption, area, and complexity, and therefore, it is difficult to improve the linearity of the TDC.

SUMMARY

This application provides a digital frequency-division phase-locked loop and a non-linear calibration method for a digital frequency-division phase-locked loop in order to implement non-linear calibration of the digital frequency-division phase-locked loop at relatively small implementation expense.

To achieve the foregoing objective, this application provides the following technical solutions.

A first aspect of this application provides a digital frequency-division phase-locked loop, including a TDC, a digital loop filter (DLF), a digital-controlled oscillator (DCO), a feedback frequency divider (DIV), a sigma-delta modulator (SDM), and a calibration apparatus. The TDC is configured to receive a reference clock signal and a feedback clock signal, and identify a phase difference between the reference clock signal and the feedback clock signal in order to obtain a digital signal indicating the phase difference. The calibration apparatus is configured to receive the digital signal, a frequency control word, and a frequency-division control word that is generated by the SDM, and compensate for the digital signal based on the frequency control word and the frequency-division control word in order to obtain a calibration signal. The DLF is configured to receive the calibration signal, and perform digital filtering on the calibration signal in order to obtain an oscillator frequency control signal. The DCO is configured to receive the oscillator frequency control signal, and generate an oscillation signal as an output signal of the digital frequency-division phase-locked loop under the control of the oscillator frequency control signal. The DIV is configured to perform frequency division on the oscillation signal in order to obtain the feedback clock signal. The SDM is configured to receive the frequency control word, and generate the frequency-division control word based on the frequency control word. The frequency control word is used to indicate a nominal frequency-division value of the digital frequency-division phase-locked loop, the nominal frequency-division value is a ratio of a frequency of the oscillation signal to a frequency of the reference clock signal, the frequency-division control word is used to indicate an actual frequency-division value of the DIV, and the actual frequency-division value is a ratio of the frequency of the oscillation signal to a frequency of the feedback clock signal. Because the digital signal output by the TDC is compensated for using the calibration apparatus and based on the frequency control word and the frequency-division control word without a need to improve the TDC, non-linear calibration of the digital frequency-division phase-locked loop can be implemented at relatively small implementation expense.

In an implementation, the calibration apparatus is configured to obtain, based on the frequency control word and the frequency-division control word, a time-domain offset between the reference clock signal and the feedback clock signal, and compensate for the digital signal based on the time-domain offset in order to obtain the calibration signal. The calibration apparatus compensates for the digital signal according to the time-domain offset between the reference clock signal and the feedback clock signal. This is easy to implement and highly implementable.

In an implementation, the calibration apparatus includes a measurer configured to obtain, based on the frequency control word and the frequency-division control word, the time-domain offset between the reference clock signal and the feedback clock signal, and a compensator configured to determine, according to a mapping relationship, a non-linear compensation value corresponding to the time-domain offset, and compensate for the digital signal using the non-linear compensation value in order to obtain the calibration signal.

In an implementation, the compensator includes a mapping unit configured to determine, according to the mapping relationship, the non-linear compensation value corresponding to the time-domain offset, and a calibrator configured to compensate for the digital signal using the non-linear compensation value in order to obtain the calibration signal.

In an implementation, the calibrator includes an adder configured to add a negative value of the non-linear compensation value and the digital signal together in order to obtain the calibration signal.

In an implementation, the mapping relationship is in a form of a lookup table.

In an implementation, the lookup table is preset in the mapping unit.

In an implementation, the calibration apparatus further includes a calculator configured to estimate a non-linear error between the time-domain offset and the digital signal, and generate, according to the non-linear error, the lookup table for compensation of the non-linear error.

In an implementation, the mapping unit is further configured to determine that the time-domain offset is not in the lookup table. The calculator is further configured to obtain the non-linear compensation value corresponding to the time-domain offset in a linear interpolation manner, and send the obtained non-linear compensation value to the calibrator.

In an implementation, the digital frequency-division phase-locked loop further includes a controller configured to disable the measurer and the calculator after the calculator obtains the non-linear error. Because functions of the measurer and the calculator are completed after the non-linear error is obtained, in this case, disabling the measurer and the calculator can reduce power consumption.

In an implementation, the measurer includes an adder, an integrator, and a multiplier. The adder is configured to add a negative value of the frequency control word and the frequency-division control word together in order to obtain a difference between the actual frequency-division value that is of the DIV and that is indicated by the frequency-division control word and the nominal frequency-division value that is of the digital frequency-division phase-locked loop and that is indicated by the frequency control word. The integrator is configured to perform time-domain integration on the difference in order to obtain an integral value. The multiplier is configured to multiply the integral value by a period of the oscillation signal in order to obtain the time-domain offset.

In an implementation, the digital frequency-division phase-locked loop is a digital fractional frequency-division phase-locked loop.

In an implementation, the calibration apparatus is configured to receive, in a preset frequency bin, the digital signal, the frequency control word, and the frequency-division control word that is generated by the SDM, and compensate for the digital signal based on the frequency control word and the frequency-division control word in order to obtain a calibration signal in the preset frequency bin. Bases for selecting the preset frequency bin are as follows. The frequency bin enables the time-domain offset between the frequency control word and the frequency-division control word to be within a preset range, and in the preset range, the time-domain offset and the digital signal meet a composition condition of a transfer function of the TDC. Performing calibration in the preset frequency bin can improve non-linear calibration precision and reduce solution implementation expense.

A second aspect of this application provides a chip, including a plurality of logic gate circuits or transistor circuits, and the foregoing digital frequency-division phase-locked loop.

BRIEF DESCRIPTION OF DRAWINGS

To describe the technical solutions in some of the embodiments of this application, the following briefly introduces the accompanying drawings describing some of the embodiments. The accompanying drawings in the following description show some embodiments of this application, and a person of ordinary skill in the art may still derive other drawings from these accompanying drawings without creative efforts.

DESCRIPTION OF EMBODIMENTS

Figure 1:
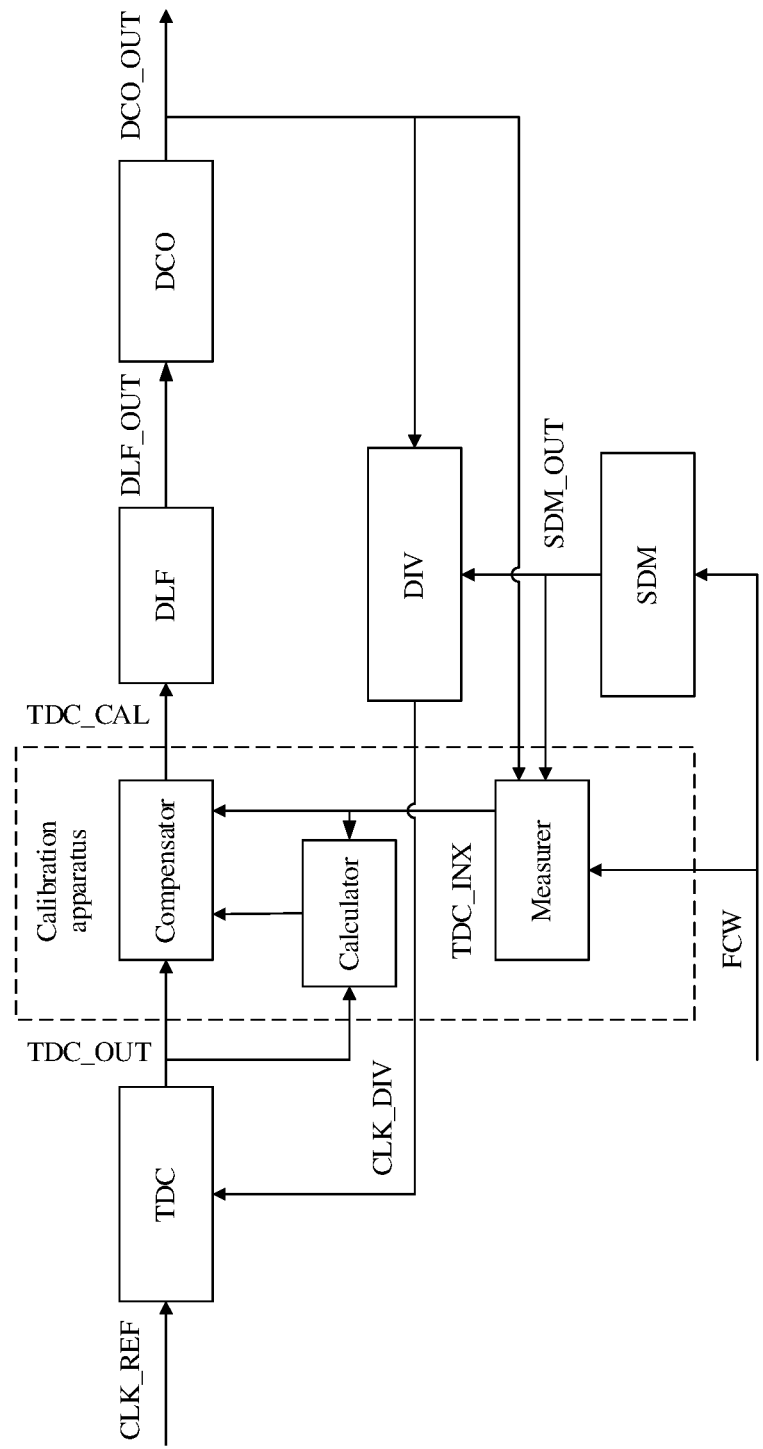
FIG. 1 is a schematic structural diagram of a digital fractional frequency-division phase-locked loop disclosed in an embodiment of this application.

FIG. 1 is a schematic structural diagram of a digital fractional frequency-division phase-locked loop disclosed in an embodiment of this application. The digital fractional frequency-division phase-locked loop includes a TDC, a DLF, a DCO, a DIV, an SDM, and a calibration apparatus.

Further, the TDC is configured to receive a reference clock signal (also referred to as CLK_REF) and a feedback clock signal (also referred to as CLK_DIV), and identify a phase difference between CLK_REF and CLK_DIV in order to obtain a digital signal (also referred to as TDC_OUT) indicating the phase difference.

The calibration apparatus is configured to receive the TDC_OUT, a frequency control word (also referred to as FCW), and a frequency-division control word (also referred to as SDM_OUT) generated by the SDM, and compensate for the TDC_OUT based on the FCW and the SDM_OUT in order to obtain a calibration signal (also referred to as TDC_CAL).

The FCW is used to indicate a nominal frequency-division value of the digital frequency-division phase-locked loop, the nominal frequency-division value is a ratio of a frequency of an oscillation signal (also referred to as DCO_OUT) to a frequency of the CLK_REF, the SDM_OUT is used to indicate an actual frequency-division value of the DIV, and the actual frequency-division value is a ratio of the frequency of the DCO_OUT to a frequency of the CLK_DIV.

The DLF is configured to receive the TDC_CAL, and perform digital filtering on the calibration signal in order to obtain an oscillator frequency control signal (also referred to as DLF_OUT).

The DCO is configured to receive the DLF_OUT, and generate the DCO_OUT as an output signal of the digital frequency-division phase-locked loop under the control of DLF_OUT.

The DIV is configured to perform frequency division on the DCO_OUT in order to obtain the CLK_DIV.

The SDM is configured to receive the FCW, and generate the SDM_OUT of the DIV based on the FCW.

Further, the calibration apparatus obtains a time-domain offset (also referred to as TDC_INX) between the CLK_REF and the CLK_DIV based on the FCW and the SDM_OUT, and compensate for the digital signal TDC_OUT based on the TDC_INX in order to obtain the TDC_CAL. In a specific embodiment, as shown in FIG. 1, the calibration apparatus includes a measurer, a calculator, and a compensator.

The measurer in the calibration apparatus in FIG. 1 is configured to obtain the TDC_INX between the CLK_REF and the CLK_DIV based on the FCW and the SDM_OUT. The TDC_INX is a theoretical input signal of the TDC.

In a studying process, an applicant concludes that, when a fractional frequency-division phase-locked loop is locked in a specific frequency bin, for a $k^{th}$ moment, an amount $T_{TDC}[k]$ of instantaneous input time of the TDC (that is, a value represented by TDC_INX) is:

$$T_{TDC}[k] = T_{DCO\_OUT} \times \sum_{i=1}^{k} N_{QERR}[i] \qquad (1)$$

That is, the amount of instantaneous input time of the TDC may be calculated using a period $T_{DCO\_OUT}$ of an output signal DCO_OUT in the frequency bin and an integral value of a difference $N_{QERR}[k]$ between a DIV instantaneous frequency-division value and a system nominal frequency-division value.

A derivation process of the foregoing conclusion is as follows.

Figure 2:
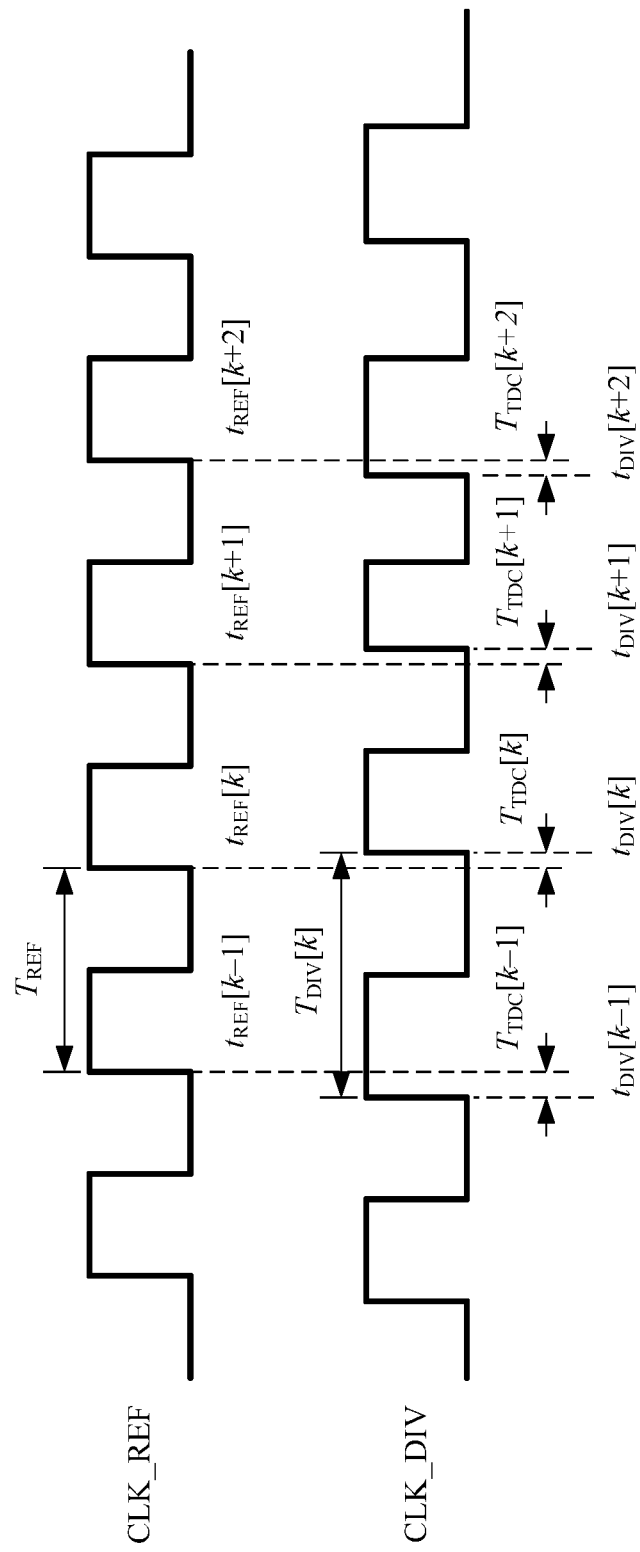
FIG. 2 is a schematic diagram of phase discrimination of a digital fractional frequency-division phase-locked loop disclosed in an embodiment of this application.

FIG. 2 is a schematic diagram of phase discrimination of a digital fractional frequency-division phase-locked loop. It may be learned from FIG. 2 that, because the CLK_DIV is controlled by the SDM, when the phase-locked loop is in a locked operating state, an instantaneous period of the CLK_DIV regularly changes. However, an instantaneous period of the CLK_REF is stable and unchanged.

For the TDC, input at a $k^{th}$ sampling moment is determined by absolute time of valid edges (for example, rising edges) of the CLK_REF and the CLK_DIV at the moment. That is, at the $k^{th}$ sampling moment, an amount of input time of the TDC is:

$$T_{TDC}[k] = t_{DIV}[k] - t_{REF}[k] \qquad (2),$$

where $t_{DIV}[k]$ is absolute time of CLK_DIV at the $k^{th}$ sampling moment, and $t_{REF}[k]$ is absolute time of the signal CLK_REF at the $k^{th}$ sampling moment. The absolute time is time in the general sense, the absolute time is different from relative time, and the relative time is a time difference. $t_{DIV}[k]$ and $t_{REF}[k]$ may be separately expressed as:

$$t_{DIV}[k] = t_{DIV}[k-1] + T_{DCO\_OUT} \times N_{DIV}[k] \qquad (3), \text{ and}$$

$$t_{REF}[k] = T_{REF} \times k \qquad (4).$$

The $N_{DIV}[k]$ is an instantaneous frequency division ratio of the DIV at the $k^{th}$ moment, that is, a current frequency division ratio of the DIV at the $k^{th}$ moment. The frequency division ratio is controlled by the SDM and regularly changes over time. In theory, a value of the frequency division ratio may be resolved into two parts:

$$N_{DIV}[k] = N_{NORM} + N_{QERR}[k] \qquad (5),$$

where $N_{NORM}$ is a nominal frequency division ratio of the digital fractional frequency-division phase-locked loop, and is expressed as:

$$N_{NORM} = \frac{f_{DCO}}{f_{REF}} = \frac{T_{REF}}{T_{DCO}}. \qquad (6)$$

It may be learned from a theory of the digital fractional frequency-division phase-locked loop that $N_{NORM}$ is a non-integer. The equation (5) and the equation (6) are substituted into the equation (3) in order to obtain the following equation:

$$\begin{aligned} t_{DIV}[k] &= t_{DIV}[k-1] + T_{DCO\_OUT} \times (N_{NORM} + N_{QERR}[k]). \qquad (7) \\ &= t_{DIV}[k-1] + T_{DCO\_OUT} \times N_{QERR}[k] + T_{REF} \end{aligned}$$

A recursion operation therein is resolved into an integral mode, and the following equation is easily obtained:

$$t_{DIV}[k] = T_{DCO\_OUT} \times \sum_{i=1}^{k} N_{QERR}[i] + T_{REF} \times k. \qquad (8)$$

The foregoing equation and the equation (7) are substituted into the equation (5) in order to obtain the amount of instantaneous input time of the TDC at the $k^{th}$ sampling moment:

$$T_{TDC}[k] = T_{DCO\_OUT} \times \sum_{i=1}^{k} N_{QERR}[i].$$

It should be noted that, it may be learned from the foregoing derivation process that, the amount of instantaneous input time of the TDC (corresponding to a specific value of the TDC_INX at a moment) is unrelated to an operating frequency of the TDC. However, the applicant finds, by studying, that different calibration precision is obtained in different frequency bins. Therefore, in actual application, a preset frequency bin may be selected to perform measurement in order to improve non-linear calibration precision and reduce solution implementation expense. Basic bases for selecting the frequency bin are as follows.

(1) The selected frequency bin should enable amounts of input time in a sequence (including an input sequence and an output sequence) of the TDC to be distributed in a large enough range, and in the range, values in an input sequence (that is, a time-domain sequence corresponding to the TDC_INX) and values in a corresponding output sequence (that is, a time-domain sequence corresponding to the digital signal output by the TDC) meet a composition condition of a transfer function of the TDC, that is, a non-linear feature of the TDC can be fully surveyed in the frequency bin.

(2) Measurement data obtained in the selected frequency bin can make a subsequent calculation operation simplified as much as possible.

Figure 3:
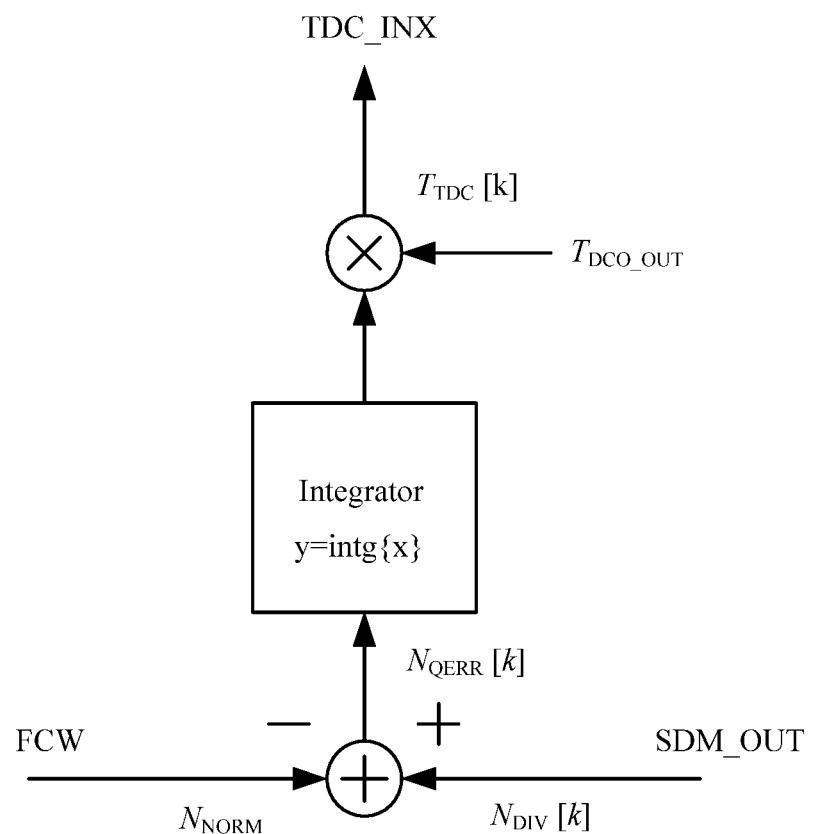
FIG. 3 is a schematic structural diagram of a measurer of a digital fractional frequency-division phase-locked loop disclosed in an embodiment of this application.

Based on the foregoing equation (1), a structure of the measurer is shown in FIG. 3, and the measurer includes an adder, an integrator, and a multiplier. In FIG. 3, an FCW value that is input in a preset frequency bin is a frequency division ratio $N_{NORM}$, a signal SDM_OUT is an output signal of the SDM in the preset frequency bin, and a value of the signal SDM_OUT is an instantaneous frequency division ratio $N_{DIV}[k]$ of the DIV. A negative FCW value (for a specific operation manner of taking the negative FCW value, refer to other approaches) and a value of the signal SDM_OUT are input into the adder, and $N_{QERR}[k]$ is obtained, $N_{QERR}[k]$ is input into the integrator, and $$\sum_{i=1}^{k} N_{QERR}[i]$$

is obtained, and then $$T_{DCO\_OUT} \times \sum_{i=1}^{k} N_{QERR}[i]$$

is obtained using the multiplier, where $T_{DCO\_OUT}$ may be obtained by measuring DCO_OUT by the measurer, or may be pre-stored in a storage medium (not drawn in FIG. 3) of the measurer. It may be learned that, a final output signal TDC_INX of a measurement unit is an amount $T_{TDC}[k]$ of input time of the TDC in the preset frequency bin at the $k^{th}$ sampling moment.

Figure 4:
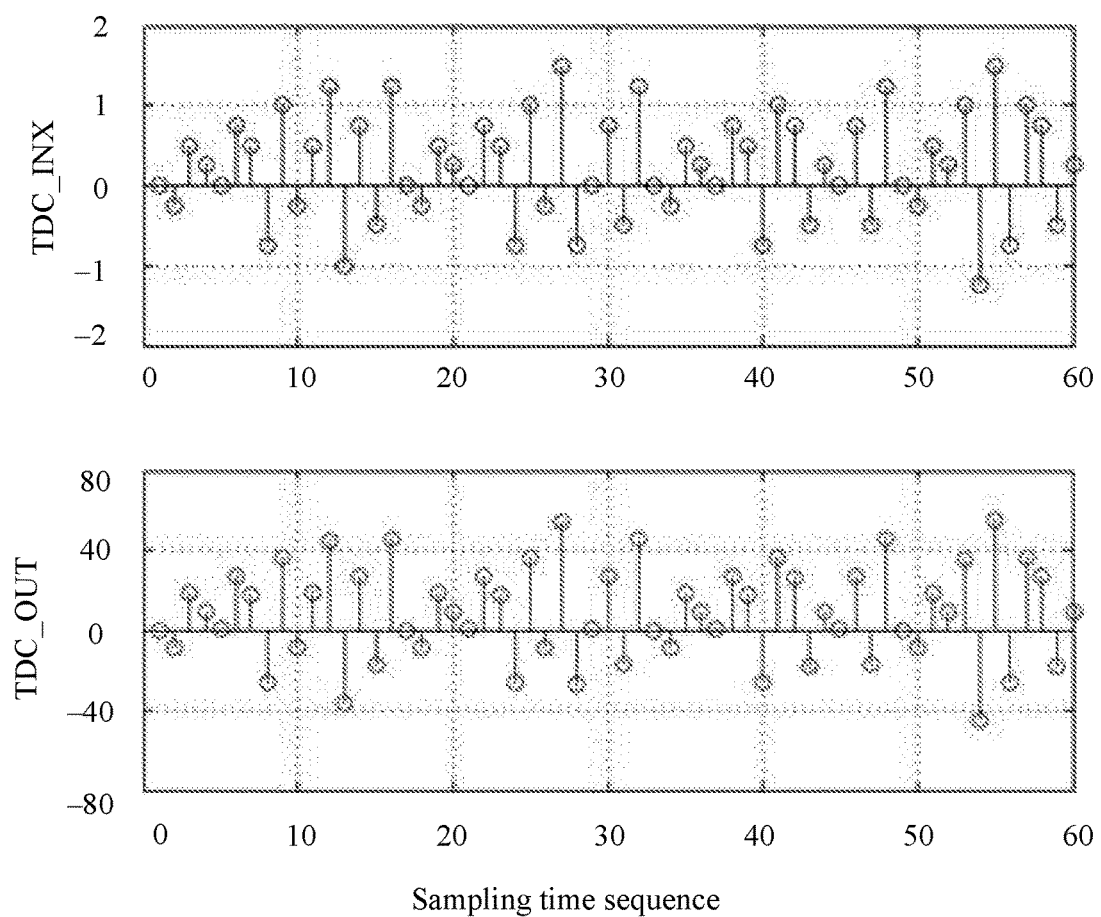
FIG. 4 is a schematic diagram of an input sequence and an output sequence of a digital fractional frequency-division phase-locked loop disclosed in an embodiment of this application.

Based on the foregoing measurement process, the measurer separately performs measurement at a plurality of sampling moments in order to obtain an input sequence (that is, time-domain offsets between the CLK_REF and the CLK_DIV that are measured at K sampling moments) including K sampling moments that is shown in FIG. 4. A correspondence between the input sequence and an output sequence is shown in FIG. 4.

Input sequence: TDC_INX∈{$T_{TDC}[1], T_{TDC}[2], \ldots, T_{TDC}[k-1], T_{TDC}[k], \ldots, T_{TDC}[K]$}.

Output sequence: TDC_OUT∈{$D_{TDC}[1], D_{TDC}[2], \ldots, D_{TDC}[k-1], D_{TDC}[k], \ldots, D_{TDC}[K]$}.

After the measurer obtains the input sequence of the TDC in the preset frequency bin, the calculator in the calibration apparatus in FIG. 1 may be configured to estimate a non-linear error between the TDC_INX and the TDC_OUT, and generate, according to the non-linear error, a lookup table (also referred to as LUT) for compensation of the non-linear error. A specific lookup table generation process includes the following.

1. Input data sorting: It may be learned from the sequence shown in FIG. 4 that, because of a control function of the SDM in the fractional phase-locked loop, data in the input sequence is not monotonic, and does not directly reflect a transfer function relationship of the TDC module. Therefore, after obtaining the input sequence, the calculation module sorts the input sequence in descending order of values:

TDC_INX=$x_{TDC}[1], x_{TDC}[2], \ldots x_{TDC}[m-1], x_{TDC}[m], \ldots x_{TDC}[M]$ (9), and TDC_OUT=$y_{TDC}[1], y_{TDC}[2], \ldots y_{TDC}[m-1], y_{TDC}[m], \ldots y_{TDC}[M]$ (10).

The equation (9) shows input values of the TDC in ascending order, and the equation (10) shows output values that are in a one-to-one correspondence with the input values in the equation (9).

2. Averaging processing: Repeated data may appear in data that is obtained from the measurement module and that is sorted in a chronological order, and therefore, in this embodiment, averaging processing is performed on TDC_OUT values corresponding to a same TDC_INX value. For example, if there are N pieces of input data of a same value in original data, that is:

$$x_{TDC}[m]=T_{TDC}[k1]=T_{TDC}[k2]=,\ldots,=T_{TDC}[kN] \quad (11),$$

corresponding TDC_OUT is:

$$y_{TDC}[m] = \frac{1}{N}\sum_{i=1}^{N}(D_{TDC}[ki]). \quad (12)$$

3. Transfer function composition: After sorting and averaging processing are performed, the input sequence and the output sequence of the TDC that are obtained from the measurement module may be sorted in a form in which the transfer function of the TDC can be expressed. The transfer function may be expressed using a function F:

$$y_{TDC}=F(x_{TDC}) \quad (13).$$

Figure 5:
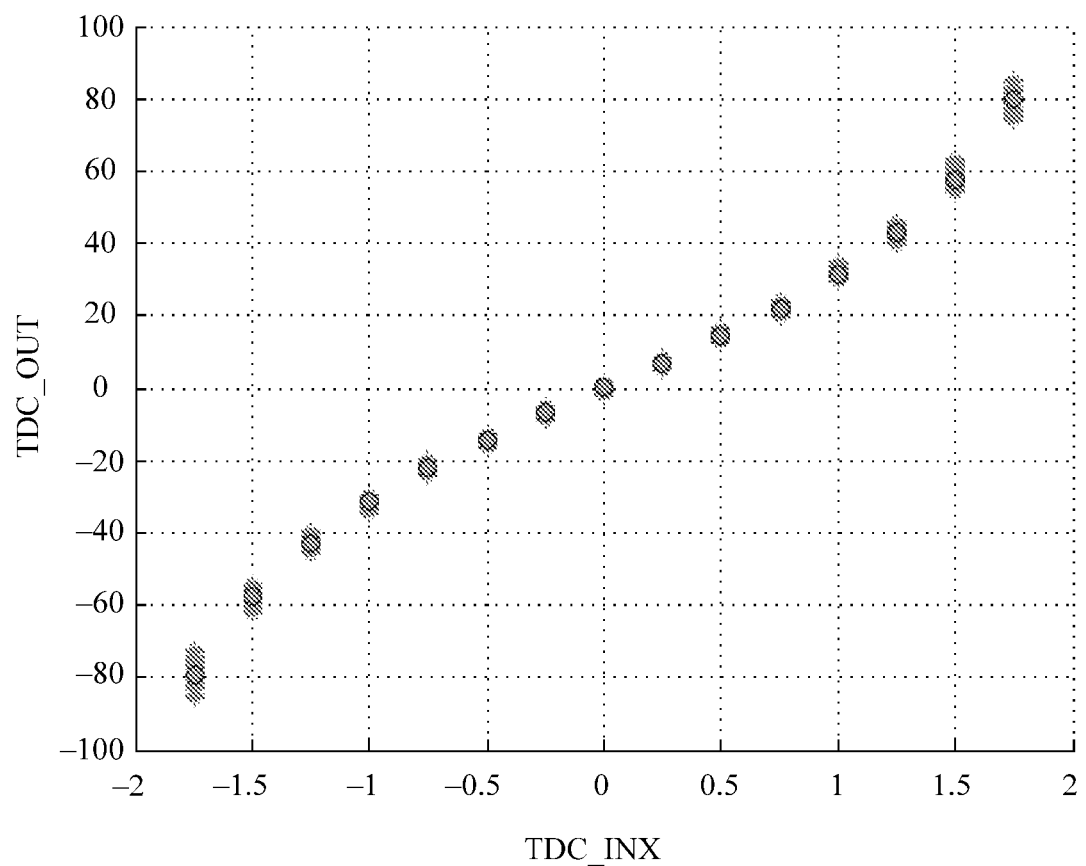
FIG. 5 is a schematic diagram of a transfer function curve of a TDC of a digital fractional frequency-division phase-locked loop disclosed in an embodiment of this application.

A transfer function curve of the TDC is shown in FIG. 5, where a black solid line represents averaged data, and a gray-filled dot represents sorted data.

4. Linear regression calculation: A non-linear feature between input and output of the TDC may be learned from FIG. 5. To compensate for the non-linear feature, in this embodiment, linear regression calculation is first performed on the transfer function, that is, a linear approximation expression of the transfer function is fitted according to the non-linear function, and then a difference between actual data and linear approximation data is calculated. Certainly, it may be understood that, a linear error may be estimated without performing linear regression calculation or non-linear function fitting. For example, in the other approaches, another linear error estimation method for estimating non-linearity between input and output of a digital signal circuit may be further provided, and this is not limited in this embodiment.

Figure 6:
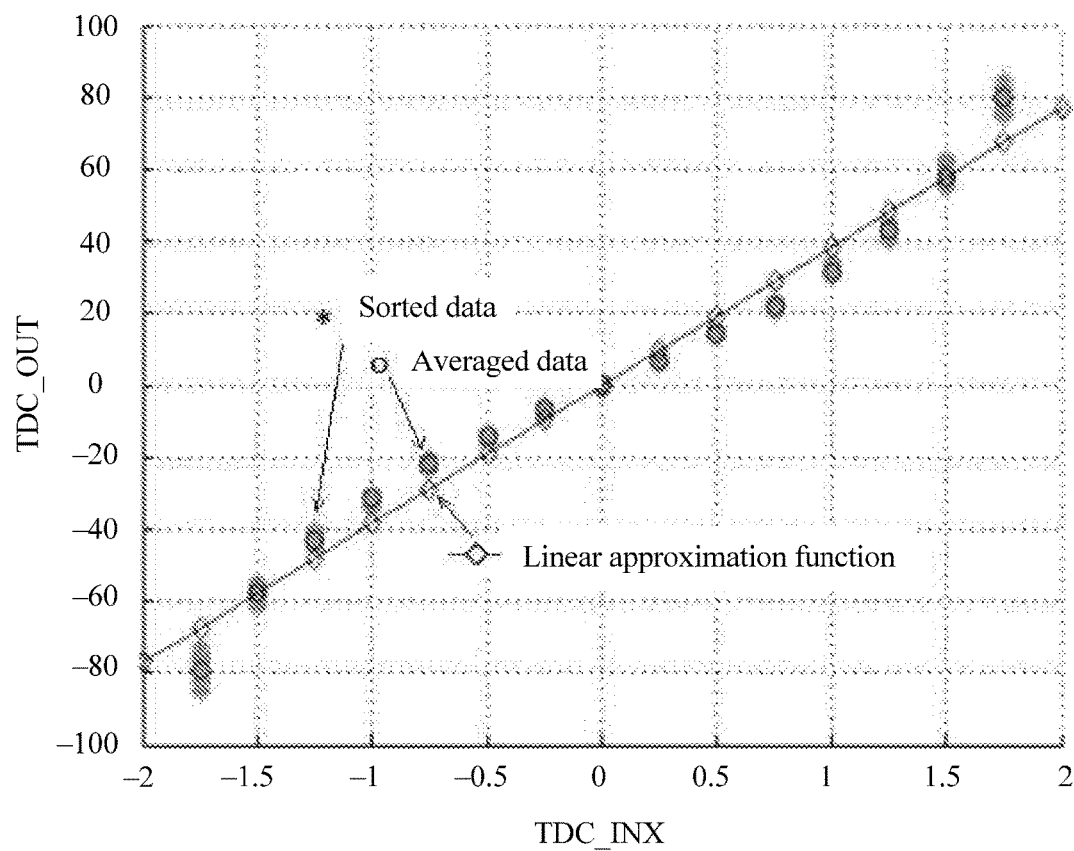
FIG. 6 is a schematic diagram of a relationship between a linear approximation function and a transfer function of a TDC of a digital fractional frequency-division phase-locked loop disclosed in an embodiment of this application.

It is assumed that linear approximation of the transfer function of the TDC may be expressed using a function $\hat{F}$:

$$\hat{y}_{TDC}=\hat{F}(x_{TDC})=\alpha \times x_{TDC}+\beta \quad (14),$$

where α is a linear gain of the TDC, and β is an offset. A relationship between the obtained linear approximation function and the transfer function is shown in FIG. 6.

Figure 7:
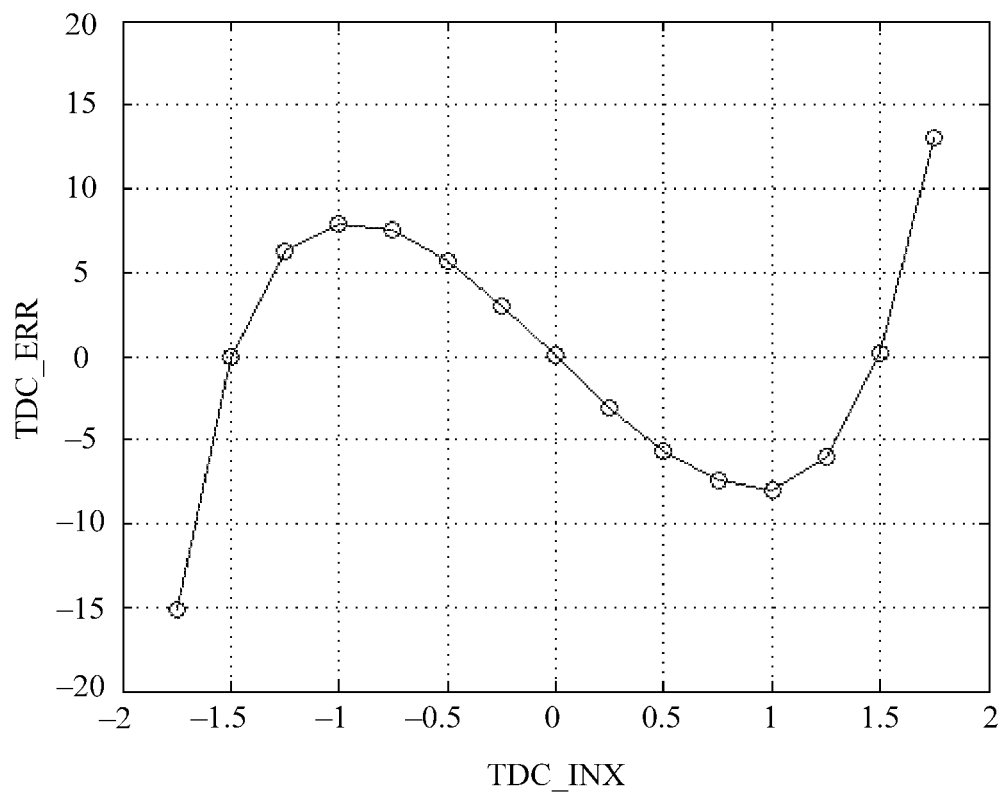
FIG. 7 is a schematic diagram of a relationship of a non-linear error function of a TDC of a digital fractional frequency-division phase-locked loop disclosed in an embodiment of this application.

A difference between the actual transfer function and the linear approximation function of the TDC is calculated, and a non-linear error function of the TDC may be obtained. As shown in FIG. 7, an equation is:

$$\varepsilon_{TDC}E(x_{TDC})=F(x_{TDC})-\hat{F}(x_{TDC}) \quad (15).$$

It may be learned from the equation (15) that, the non-linear error function indicates the difference between the transfer function and the linear approximation function of the TDC, that is, defines a non-linear feature of the transfer function of the TDC. It may be learned from the non-linear error function shown in FIG. 7 that, for a specific input value of the TDC, a non-linear error value corresponding to the input value is fixed. If the error value is compensated for in the system, that is, a linear TDC transmission feature may be fitted at an output end of the TDC, a linear feature of the TDC is improved.

5. Lookup table generation: In chip design, the foregoing error function may be set in a mapping unit in a form of a table, and the mapping unit determines, using a specific mapping relationship, a non-linear compensation value corresponding to the time-domain offset in order to compensate for non-linearity of the phase-locked loop. Therefore, the error function is stored in a mapping unit of the compensator in a form of a mapping relationship. For example, Table 1 may be set.

TABLE 1

| Input value | Output value |
|---|---|
| $x_{TDC}[1]$ | $\varepsilon_{TDC}[1]$ |
| $x_{TDC}[2]$ | $\varepsilon_{TDC}[1]$ |
| ... | ... |
| $x_{TDC}[m-1]$ | $\varepsilon_{TDC}[m-1]$ |
| $x_{TDC}[m]$ | $\varepsilon_{TDC}[m]$ |
| ... | ... |
| $x_{TDC}[M]$ | $\varepsilon_{TDC}[M]$ |

Alternatively, the foregoing calculator is not a necessary component in this embodiment of the present disclosure. A function of the calculator is only to obtain the lookup table and input the lookup table into the mapping unit of the following compensator. If there is no calculator in the calibration apparatus, the lookup table may be preset in the mapping unit. The lookup table may be set, according to experience and with reference to actual measurement, by a person skilled in the art. The lookup table may be further preset in the mapping unit in a form of a circuit.

After the lookup table is generated, the compensator in the calibration apparatus in FIG. 1 queries the lookup table according to a theoretical input value (that is, the time-domain offset between the CLK_REF and the CLK_DIV) of the TDC that is measured by the measurer, determines a compensation value corresponding to the theoretical input value, and compensates for an output signal of the TDC.

Figure 8:
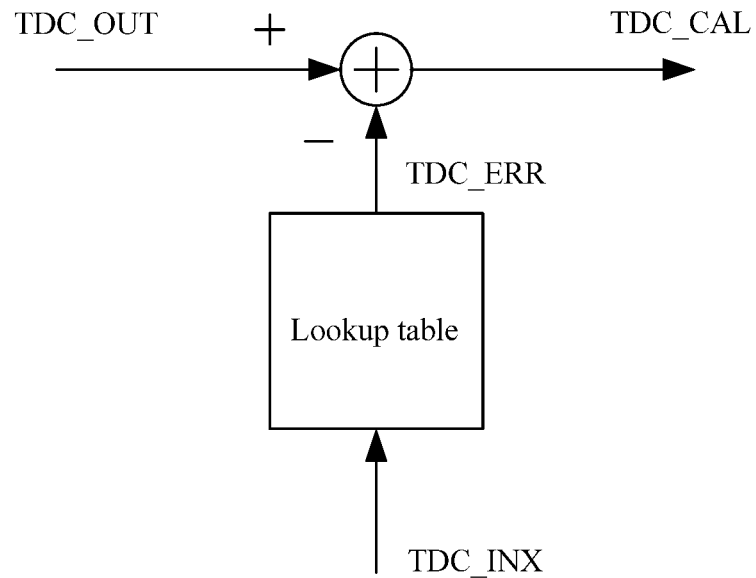
FIG. 8 is a schematic structural diagram of a compensator of a digital fractional frequency-division phase-locked loop disclosed in an embodiment of this application.

FIG. 8 is an example of a schematic structural diagram of a compensator, and the compensator includes a mapping unit and a calibrator. Further, the calibrator includes an adder shown in FIG. 8. The mapping unit determines, according to the mapping relationship, the non-linear compensation value corresponding to the time-domain offset. For example, the mapping unit stores the lookup table, and after obtaining a theoretical input value of the TDC at a sampling moment k from the measurer, the mapping unit determines, by querying the lookup table, a non-linear compensation value TDC_ERR corresponding to the input value, and outputs the non-linear compensation value TDC_ERR. The adder adds a negative compensation value (for a manner of taking the negative value, refer to the other approaches) and an output sequence TDC_OUT of the TDC together in order to obtain a compensated output sequence, and the compensated output sequence is further a value of a TDC_CAL.

It should be noted that, for the digital fractional frequency-division phase-locked loop, the input value of the TDC is related to an output frequency value of the phase-locked loop. A different output frequency value leads to a different input value of the TDC. Because the non-linear feature of the TDC is relatively stable, it may be unnecessary to create a different lookup table for a different output frequency bin. In this case, for an input value that is not in the lookup table, a table querying operation may be performed in a linear interpolation manner. For example, for any input value $x'_{TDC}$ of the TDC, the value is not in a set of finite discrete input values in an existing lookup table, that is:

$$x'_{TDC} \notin \{x_{TDC}[1], x_{TDC}[2], \ldots x_{TDC}[m-1], x_{TDC}[m], \ldots x_{TDC}[M]\} \quad (16).$$

However, in the set of input values in the lookup table, there are certainly two consecutive values that meet a condition that $x'_{TDC}$ is between the two values:

$$x_{TDC}[i] < x'_{TDC} < x_{TDC}[i+1] \quad (17).$$

For the input value, an output value corresponding to the input value may be obtained in the linear interpolation manner:

$$\varepsilon'_{TDC} = \varepsilon_{TDC}[i] + \frac{\varepsilon_{TDC}[i+1] - \varepsilon_{TDC}[i]}{x_{TDC}[i+1] - x_{TDC}[i]} \times (x'_{TDC} - x_{TDC}[i]). \quad (18)$$

It may be learned from the foregoing equation that table querying may be implemented for any input value of the TDC in the linear interpolation method. That is, to meet a requirement for a phase-locked loop system to operate in each output frequency bin, the calibration apparatus in this embodiment only needs to create one lookup table in a particular output frequency bin of the phase-locked loop. Therefore, a lookup algorithm related to the lookup table that is provided in this embodiment may be flexibly adjusted.

In addition, because the non-linear feature of the TDC is relatively stable, it may be unnecessary to update the generated lookup table. Certainly, the lookup table may be updated, and updating may be performed by the calculator. However, generally, it is unnecessary to perform updating. If the lookup table cannot be updated, as described above, the lookup table may be preset in the mapping unit, and consequently, the calculator may be omitted.

Certainly, the lookup table manner is only an implementation of obtaining the non-linear compensation value by the mapping unit. Alternatively, the mapping unit may calculate the non-linear compensation value in a logical operation circuit manner, instead of using the lookup table function shown in FIG. 8. Further, the logical operation circuit may include a large quantity of transistors or logic gates, and may be obtained by implementing the mapping relationship in the mapping unit in a form of an algorithm circuit. The algorithm circuit in the mapping unit obtains the theoretical input value (the time-domain offset) and performs operation in order to obtain the non-linear compensation value by means of calculation. This is not limited in this embodiment.

The digital fractional frequency-division phase-locked loop shown in FIG. 1 may further include a controller (not drawn in FIG. 1) configured to disable the measurer and the calculator after the calculator obtains the non-linear error in order to reduce power consumption.

Figure 9:
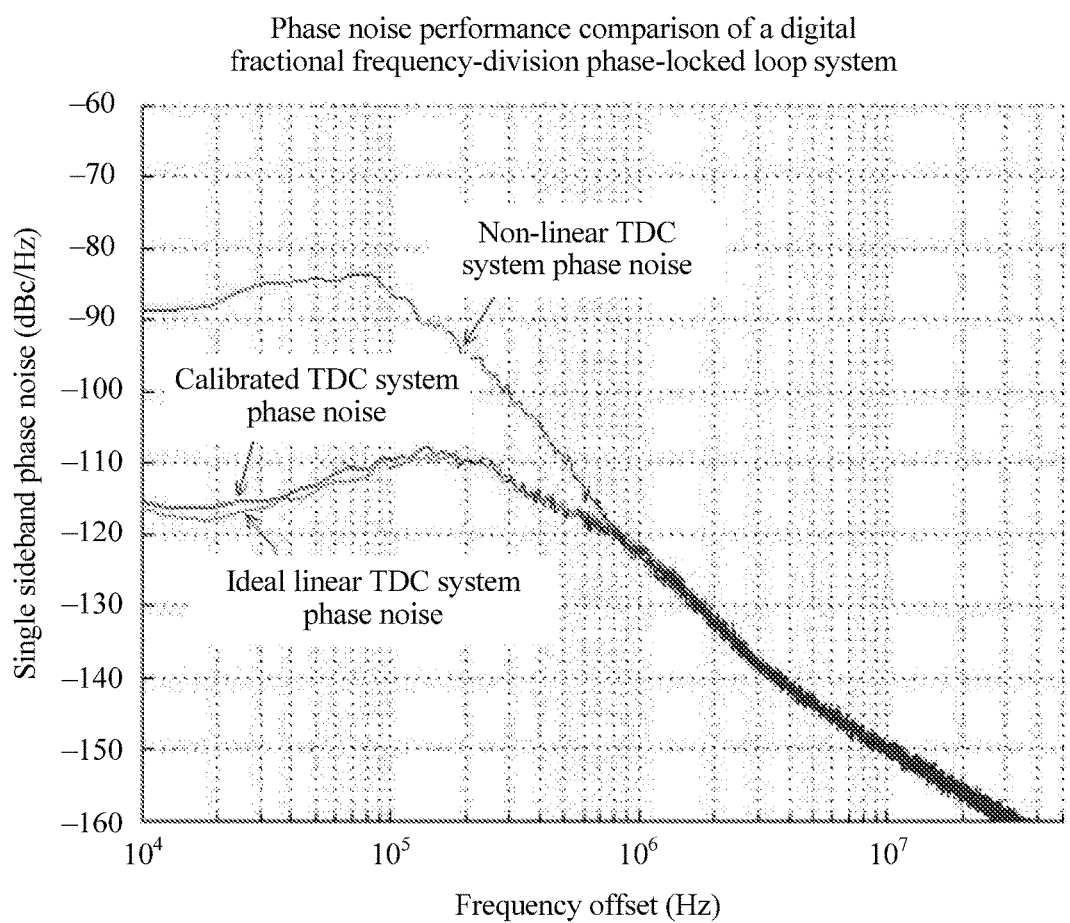
FIG. 9 is a schematic diagram of a noise reduction function of a digital fractional frequency-division phase-locked loop disclosed in an embodiment of this application.

FIG. 9 is a schematic diagram of a noise reduction function of the digital fractional frequency-division phase-locked loop shown in FIG. 1. It may be learned from the figure that, after the calibration apparatus in this embodiment performs calibration, system phase noise of the TDC is significantly reduced, and is closer to ideal system phase noise of the TDC.

It should be noted that, components or parts in the digital fractional frequency-division phase-locked loop that are mentioned in this embodiment may include a plurality of transistors in order to perform corresponding signal processing. The digital fractional frequency-division phase-locked loop may be included in a chip including a plurality of logic gate circuits or transistor circuits, for example, an RF chip (RFIC), and the RFIC may be used in various communications devices such as a radio base station or a wireless terminal.

It should be noted that, the digital fractional frequency-division phase-locked loop in this embodiment may further implement an integer frequency-division function, and therefore, this embodiment of the present disclosure may be extended and applied to a digital frequency-division phase-locked loop that can implement integer frequency division and fractional frequency division.

What is claimed is:

1. A digital frequency-division phase-locked loop, comprising:
   a time-to-digital converter (TDC) configured to:
      receive a reference clock signal and a feedback clock signal; and
      identify a phase difference between the reference clock signal and the feedback clock signal to obtain a digital signal indicating the phase difference;
   a calibration apparatus coupled to the TDC and configured to:
      receive the digital signal, a frequency control word, and a frequency-division control word generated by a sigma-delta modulator (SDM) coupled to the calibration apparatus; and
      compensate for the digital signal based on the frequency control word and the frequency-division control word to obtain a calibration signal, the frequency control word indicating a nominal frequency-division value of the digital frequency-division phase-locked loop, the nominal frequency-division value being a ratio of a frequency of an oscillation signal to a frequency of the reference clock signal, the frequency-division control word indicating an actual frequency-division value of a feedback frequency divider (DIV) coupled to the TDC, and the actual frequency-division value being a ratio of the frequency of the oscillation signal to a frequency of the feedback clock signal;
   a digital loop filter (DLF) coupled to the calibration apparatus and configured to:
      receive the calibration signal; and
      perform digital filtering on the calibration signal to obtain an oscillator frequency control signal,
   the DIV being configured to perform frequency division on the oscillation signal to obtain the feedback clock signal,
   the SDM being configured to:
      receive the frequency control word; and
      generate the frequency-division control word based on the frequency control word; and
   a digital-controlled oscillator (DCO) coupled to the DLF and configured to:
      receive the oscillator frequency control signal; and
      generate the oscillation signal as an output signal of the digital frequency-division phase-locked loop under the control of the oscillator frequency control signal.

2. The digital frequency-division phase-locked loop of claim 1, wherein the calibration apparatus is further configured to:
   obtain, based on the frequency control word and the frequency-division control word, a time-domain offset between the reference clock signal and the feedback clock signal; and
   compensate for the digital signal based on the time-domain offset to obtain the calibration signal.

3. The digital frequency-division phase-locked loop of claim 2, wherein the calibration apparatus comprises:
   a measurer configured to obtain, based on the frequency control word and the frequency-division control word, the time-domain offset between the reference clock signal and the feedback clock signal; and
   a compensator coupled to the measurer and configured to:
      determine, according to a mapping relationship, a non-linear compensation value corresponding to the time-domain offset; and
      compensate for the digital signal using the non-linear compensation value to obtain the calibration signal.

4. The digital frequency-division phase-locked loop of claim 3, wherein the compensator comprises:
   a mapping device configured to determine, according to the mapping relationship, the non-linear compensation value corresponding to the time-domain offset; and
   a calibrator coupled to the mapping device and configured to compensate for the digital signal using the non-linear compensation value to obtain the calibration signal.

5. The digital frequency-division phase-locked loop of claim 4, wherein the calibrator comprises an adder configured to add a negative value of the non-linear compensation value and the digital signal together to obtain the calibration signal.

6. The digital frequency-division phase-locked loop of claim 4, wherein the mapping relationship is in a form of a lookup table.

7. The digital frequency-division phase-locked loop of claim 6, wherein the lookup table is preset in the mapping device.

8. The digital frequency-division phase-locked loop of claim 6, wherein the calibration apparatus further comprises a calculator coupled to the measurer and the compensator and configured to:
   estimate a non-linear error between the time-domain offset and the digital signal; and
   generate, according to the non-linear error, the lookup table for compensation of the non-linear error.

9. The digital frequency-division phase-locked loop of claim 8, further comprising a controller coupled to the calibration apparatus and configured to disable the measurer and the calculator after the calculator obtains the non-linear error.

10. The digital frequency-division phase-locked loop of claim 3, wherein the measurer comprises:
    an adder configured to add a negative value of the frequency control word and the frequency-division control word together to obtain a difference between the actual frequency-division value of the DIV indicated by the frequency-division control word and the nominal frequency-division value of the digital frequency-division phase-locked loop indicated by the frequency control word;
    an integrator coupled to the adder and configured to perform time-domain integration on the difference to obtain an integral value; and
    a multiplier coupled to the adder and the integrator and configured to multiply the integral value by a period of the oscillation signal to obtain the time-domain offset.

11. The digital frequency-division phase-locked loop of claim 1, wherein the digital frequency-division phase-locked loop is a digital fractional frequency-division phase-locked loop.

12. A chip, comprising:
a plurality of logic gate circuits or transistor circuits; and
a digital frequency-division phase-locked loop coupled to the logic gate circuits or the transistor circuits and comprising:
  a time-to-digital converter (TDC) configured to:
    receive a reference clock signal and a feedback clock signal; and
    identify a phase difference between the reference clock signal and the feedback clock signal to obtain a digital signal indicating the phase difference;
  a calibration apparatus coupled to the TDC and configured to:
    receive the digital signal, a frequency control word, and a frequency-division control word generated by a sigma-delta modulator (SDM) coupled to the calibration apparatus; and
    compensate for the digital signal based on the frequency control word and the frequency-division control word to obtain a calibration signal, the frequency control word indicating a nominal frequency-division value of the digital frequency-division phase-locked loop, the nominal frequency-division value being a ratio of a frequency of an oscillation signal to a frequency of the reference clock signal, the frequency-division control word indicating an actual frequency-division value of a feedback frequency divider (DIV) coupled to the TDC, and the actual frequency-division value being a ratio of the frequency of the oscillation signal to a frequency of the feedback clock signal;
  a digital loop filter (DLF) coupled to the calibration apparatus and configured to:
    receive the calibration signal; and
    perform digital filtering on the calibration signal to obtain an oscillator frequency control signal,
  the DIV being configured to perform frequency division on the oscillation signal to obtain the feedback clock signal,
  the SDM being configured to:
    receive the frequency control word; and
    generate the frequency-division control word based on the frequency control word; and
  a digital-controlled oscillator (DCO) coupled to the DLF and configured to:
    receive the oscillator frequency control signal; and
    generate the oscillation signal as an output signal of the digital frequency-division phase-locked loop under the control of the oscillator frequency control signal.

13. The chip of claim 12, wherein the calibration apparatus is further configured to:
  obtain, based on the frequency control word and the frequency-division control word, a time-domain offset between the reference clock signal and the feedback clock signal; and
  compensate for the digital signal based on the time-domain offset to obtain the calibration signal.

14. The chip of claim 13, wherein the calibration apparatus comprises:
  a measurer configured to obtain, based on the frequency control word and the frequency-division control word, the time-domain offset between the reference clock signal and the feedback clock signal; and
  a compensator coupled to the measurer and configured to:
    determine, according to a mapping relationship, a non-linear compensation value corresponding to the time-domain offset; and
    compensate for the digital signal using the non-linear compensation value to obtain the calibration signal.

15. The chip of claim 14, wherein the compensator comprises:
  a mapping device configured to determine, according to the mapping relationship, the non-linear compensation value corresponding to the time-domain offset; and
  a calibrator coupled to the mapping device and configured to compensate for the digital signal using the non-linear compensation value to obtain the calibration signal.

16. The chip of claim 15, wherein the calibrator comprises an adder configured to add a negative value of the non-linear compensation value and the digital signal together to obtain the calibration signal.

17. The chip of claim 15, wherein the mapping relationship is in a form of a lookup table.

18. The chip of claim 17, wherein the lookup table is preset in the mapping device.

19. The chip of claim 17, wherein the calibration apparatus further comprises a calculator configured to:
  estimate a non-linear error between the time-domain offset and the digital signal; and
  generate, according to the non-linear error, the lookup table for compensation of the non-linear error.

20. The chip of claim 19, further comprising a controller configured to disable the measurer and the calculator after the calculator obtains the non-linear error.

* * * * *